United States Patent [19]

Griesinger

[11] Patent Number: 5,109,419
[45] Date of Patent: Apr. 28, 1992

[54] ELECTROACOUSTIC SYSTEM

[75] Inventor: David H. Griesinger, Cambridge, Mass.

[73] Assignee: Lexicon, Inc., Waltham, Mass.

[21] Appl. No.: 525,407

[22] Filed: May 18, 1990

[51] Int. Cl.$^5$ .............................................. H03G 3/00
[52] U.S. Cl. ...................................... 381/63; 84/630; 84/707
[58] Field of Search ...................... 381/63, 82, 83, 62; 84/630, 707

[56] References Cited

U.S. PATENT DOCUMENTS

| | | | |
|---|---|---|---|
| 4,361,727 | 11/1982 | Franssen et al. | 381/63 |
| 4,618,987 | 10/1986 | Steinke . | |
| 4,649,564 | 3/1987 | Barnett | 381/63 |
| 4,955,057 | 9/1990 | Tominari | 381/63 |

FOREIGN PATENT DOCUMENTS

| | | |
|---|---|---|
| 335468 | 10/1989 | European Pat. Off. . |
| 138267 | 10/1979 | German Democratic Rep. . |
| 138266 | 10/1989 | German Democratic Rep. . |
| 0050200 | 3/1982 | Japan .................. 381/82 |
| WO8909465 | 10/1989 | PCT Int'l Appl. . |

OTHER PUBLICATIONS

Griesinger, David, *Practical Processors and Programs for Digital Reverberation*, AES 7th International Conference, Mar., 1989, pp. 187–195.
Krokstad, Asbjern, *Electroacoustic Means of Controlling Auditorium Acoustics*, Sep., 1985, pp. 1–18.
Ahnert, Wolfgang, *The Complex Simulation of Acoustical Sound Fields by the Delta Stereophony System DDS*, 2418 (D-16), Nov., 1986, pp. 1–26.
Berkhout, A. J., *A Holographic Approach to Acoustic Control*, J. Audio Eng. Soc., vol. 36, No. 12, Dec., 1988.

Primary Examiner—Forester W. Isen
Assistant Examiner—Sylvia Chen
Attorney, Agent, or Firm—Fish & Richardson

[57] ABSTRACT

An electroacoustic system for acoustic enhancement of a room that includes a sound source location. The electroacoustic system includes a microphone spaced from the sound source location, an array of loudspeakers arranged in at least four interleaved banks, each bank including at least one loudspeaker, and signal processing electronics connected between the microphone and the speaker banks that includes an input channel, circuitry connecting the microphone to the input channel, a plurality of output channels corresponding in number to the number of speaker banks, circuitry connecting each output channel to a corresponding speaker bank, and at least four statistically independent time-variant reverberation units responsive to input signals from the microphone for producing output signals on the output channels for driving the several banks of speakers.

30 Claims, 2 Drawing Sheets

ELECTROACOUSTIC SYSTEM

This invention relates to electroacoustic systems for acoustic enhancement of concert halls, auditoria and the like.

Many rooms and halls intended for musical performances suffer from acoustical problems such as inadequate reverberation time or level, insufficient lateral energy, or excessive initial time delay. A variety of electroacoustic systems have been proposed to help with these problems, such as Assisted Resonance (AR), Multi Channel Reverberation (MCR), and more recently Acoustic Control Systems (ACS). Such systems have various difficulties, including complex system design, high expense, marginal stability, sound coloration, and degradation of intelligibility for speech, and are limited in their performance by acoustic feedback between the microphones and the speaker bank. For high quality, such systems usually must be operated with a safety margin such that each channel has a system gain of least eight dB below the gain at which that channel begins to ring. In general, performance of such systems increases with the square root of the number of channels—such that if the number of independently connected microphones and loudspeakers doubles, the reverberent level can be raised three dB, or the source microphone distance can be increased by a factor of 1.4.

Electroacoustic systems in accordance with the invention provide a number of improvements. Adding a delay element with a time-varying transfer function to each channel increases the system gain possible before ringing starts by about six dB. The addition of such delay elements also allows the eight dB safety margin to be reduced to six dB without creating objectionable coloration. The time varying delay elements can be combined into time varying reverberation units, which are used to interconnect the microphones and loudspeakers involved in the system. The number of acoustic feedback paths between a number of microphones (M) and a number of loudspeakers (N) is equal to the product N*M. Similarly, there are N*M possible electrical paths between M microphones and N loudspeakers, and independent time-varying delay elements (which are termed reverberation units herein) are incorporated in such electrical paths. From the standpoint of stability such a system behaves like a system of N*M channels, even though the number of microphones and loudspeaker banks is much less.

This multiplication of the effectiveness of a small number of microphones and loudspeakers greatly reduces system complexity over previous systems. To appreciate how great this simplification can be in practice, from the standpoint of stability, a system designed in accordance with the invention with two microphones and eight output channels will behave as if it had sixteen channels. However, due to the additional six dB of stability also provided by the time-varying elements, this system is equivalent to an older multichannel system of sixty-four channels.

The stability of a system in accordance with the invention can be described using the concept of "critical distance" which is inversely proportional to the relative loudness of reverberation in a hall or room. The critical distance (CD) of a hall is the distance where the reverberant energy from an omnidirectional sound source and the direct sound energy are equal. If the natural critical distance (NCD) is much greater than the enhancement critical distance (ECD) created by the enhancement system, all the reverberant energy at the microphone is potentially feedback energy from the system. When the microphone and the loudspeakers in an enhancement system are separated by much more than the enhancement critical distance (ECD), the feedback energy from the loudspeaker to the microphone comes from all around the microphone.

If the microphone is located at exactly the enhancement critical distance (ECD) from the source, the total feedback gain in a single channel system is unity—that is, the feedback energy and the direct energy are equal at the position of the microphone, and the system will ring and not work. Also, in general, whenever the system feedback gain is greater than minus twelve dB in a broadband system, the system will ring. For high quality, the feedback should be at least eight dB lower, that is minus twenty dB. A system in accordance with the invention can be made to work, for example, by decreasing the distance (SD) from the microphone to the source and/or by increasing the number of reverberators. Time variance allows the feedback to be six dB higher and reduces the safety margin needed from eight dB to six dB. In addition, each doubling of the number of reverberation units gains another three dB. Use of cardioid microphones picks up about five dB of gain before feedback. These relationships can be expressed as:

$$20*\text{Log}(SD/ECD) <= 10*\text{Log}(\# \text{ of reverberation units}) - 7.2 \text{ dB},$$

which may be simplified to:

$$SD/ECD <= \sqrt{(\# \text{ of reverberation units})}\ /2.3.$$

In a particular embodiment using sixteen reverberators, somewhat lower bandwidth, and hypercardioid microphones, this criterion is: $SD <= 2.2 ECD$; and the more generalized criterion is:

$$SD/ECD <= \sqrt{(\# \text{ of reverberation units})}\ /1.75.$$

This equation provides a simple means for predicting the number of microphones and loudspeaker banks in any particular embodiment, once the desired ECD and SD are known.

In accordance with one aspect of the invention, there is provided an electroacoustic system for acoustic enhancement of a room that includes a sound source location, the electroacoustic system including a microphone spaced from the sound source location, an array of loudspeakers arranged in at least four interleaved banks, each bank including at least one loudspeaker, and signal processing electronics connected between the microphone and the speaker banks that includes an input channel, circuitry connecting the microphone to the input channel, a plurality of output channels corresponding in number to the number of speaker banks, circuitry connecting each output channel to a corresponding speaker bank, and at least four statistically independent time-variant reverberation units responsive to input signals from the microphone for producing output signals on the output channels for driving the several banks of speakers.

In preferred embodiments, each reverberation unit has a randomly varying transfer function with a time-energy curve that has a relatively slow build up followed by a relatively long diffuse plateau before exponential decay; and the transfer functions of the reverberation units are varied independently of one another with different sets of random numbers. The amplitude and time delay of each reflection is varied randomly with time so that there is no correlation between the individual transfer functions, and after a period of about one second, there is no auto-correlation of an individual transfer function with itself.

Preferably, the system includes a plurality of microphones spaced from the sound source location, each speaker bank includes a plurality of loudspeakers, the signal processing electronics includes a plurality of input channels corresponding in number to the number of microphones, and the number of statistically independent time-variant reverberation units is equal to the product of the number of microphones and the number of speaker banks.

In a particular embodiment, each microphone is of the cardioid type which raises the level of the direct sound relative to the reverberant energy by 1.7; the microphones may be spaced from the sound source location (SD) more than a factor of two beyond the critical distance (CD), the signal processing electronics are of the digital type; a one-third octave equalizer, a microphone pre-amplifier, and a limiter (level limiting circuit) connected in circuit between each microphone and the reverberation units; and a power amplifier connected in circuit between each reverberation unit and its corresponding speaker bank. The loudspeakers are recessed into the ceilings of the under balcony area and of the main hall, and each is covered with a perforated metal grille and painted to match the rest of the ceiling.

Preferably, the speakers in the several banks are disposed so that no two adjacent speakers are driven from the same output channel (every speaker in each bank is spaced from another speaker in that bank by at least one speaker from another bank).

In accordance with another aspect, the signal processing electronics includes music/speech analysis circuitry responsive of the music, speech or other input from the microphones for automatically adjusting reverb characteristics of the reverberation units; and in a particular embodiment, that music/speech analysis circuitry includes envelope detector circuitry that has a relatively short RC time constant, peak and valley detector circuitries that have RC time constants several times as long as the time constant of the envelope detector circuitry, and gain modifying circuitry. The analysis circuitry automatically provides lower reverberant levels when the hall is used for speech and larger reverberant levels when the hall is used for music.

The time-energy curves of the reverberation units are preferably tailored to provide relatively high RT20 vs RT60 (20 dB decay time vs 60 dB decay time), high diffusion, freedom from echo, non-critical speaker placement, and high intelligibility. Preferably, the start of the reflected energy is within about fifteen milliseconds of the direct energy. The time-variant reverberators allow a statistically independent connection between microphones and loudspeakers. For example, in a system in accordance with the invention with two microphones and eight output channels, there are sixteen independent acoustic paths between each speaker bank and each microphone; each microphone is connected to each speaker bank by one of sixteen independent reverberators; and about one hundred twenty loudspeakers are recessed into the ceiling of the under balcony area and into the ceiling of the main hall. Due to the approximate six dB of additional stability supplied by the time-varying transfer functions, that system has stability similar to an MCR system with sixty-four channels, even when the microphones must be placed far back in the reverberant field. Substantial advantages over an MCR system in stability, coloration, and independent control over reverb time and reverb level occur when the microphones can be placed closer to the stage.

Preferably, the reverberators are all identical in design, but vary independently with a different set of random numbers; a small number of microphones are placed in the vicinity of the sound source(s); and the microphone signals are not mixed until after they have been randomized. In particular embodiments, the reverberator time-energy curve has a relatively slow build up followed by a relatively long diffuse plateau before exponential decay starts. This type of time-energy curve increases RT20 without increasing RT60 very much. The reverberators themselves can run entirely in the digital domain.

Directional microphones are preferably used where the sound sources are confined to one end of the room. When the microphones can be close to the stage, the reverb time can be controlled electronically inside the reverberators while still achieving adequate reverb level in the hall. A system in accordance with the invention installed in a small hall with a lot of natural absorption makes that hall sound like a much larger hall.

The speakers are preferably wired to the different output channels of the electronics such that no two adjacent loudspeakers are driven from the same channel. In practice this means that at least four output channels must be provided. The wiring is similar to the tiling of a surface with different colors so that no boundaries share the same color. Because the speakers are tiled, the radiation pattern is diffuse, and a great deal of lateral sound results. Even where no speakers are installed in the walls, the reflections of the ceiling speakers from wall surfaces produces what sounds like an infinite ceiling, and the sound pattern has high lateral energy even near the sides of the hall. A system of this type is much less expensive than employing architectural modifications to achieve similar acoustics.

Other features and advantages of the invention will be seen as the following description of a particular embodiment progresses, in conjunction with drawings, in which.

DESCRIPTION OF PARTICULAR EMBODIMENT

Figure 1:
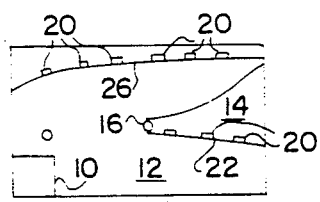
FIG. 1 is a diagrammatic side view of a concert hall in accordance with the invention.
Figure 2:
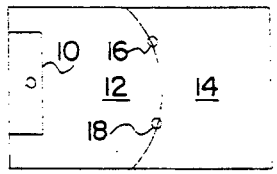
FIG. 2 is a diagrammatic top view of the concert hall of FIG. 1.
Figure 3:
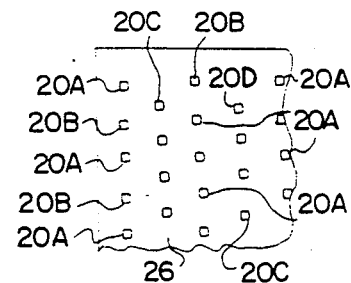
FIG. 3 is a diagrammatic view of a concert hall ceiling showing a loudspeaker arrangement.

Shown in FIGS. 1-3 is a concert hall with stage 10 that functions as a sound source; orchestra seating area 12; balcony 14 that extends over the rear of the orchestra area 12 and that has B&K cardioid condensor microphones 16, 18 in the face of the balcony; and Paradigm 3 mini speakers 20 in the balcony ceiling portion 22 above the rear of the orchestra area 12 and in main ceiling 26. A "tiled" arrangement of speakers 20 is shown in FIG. 3.

Figure 4:
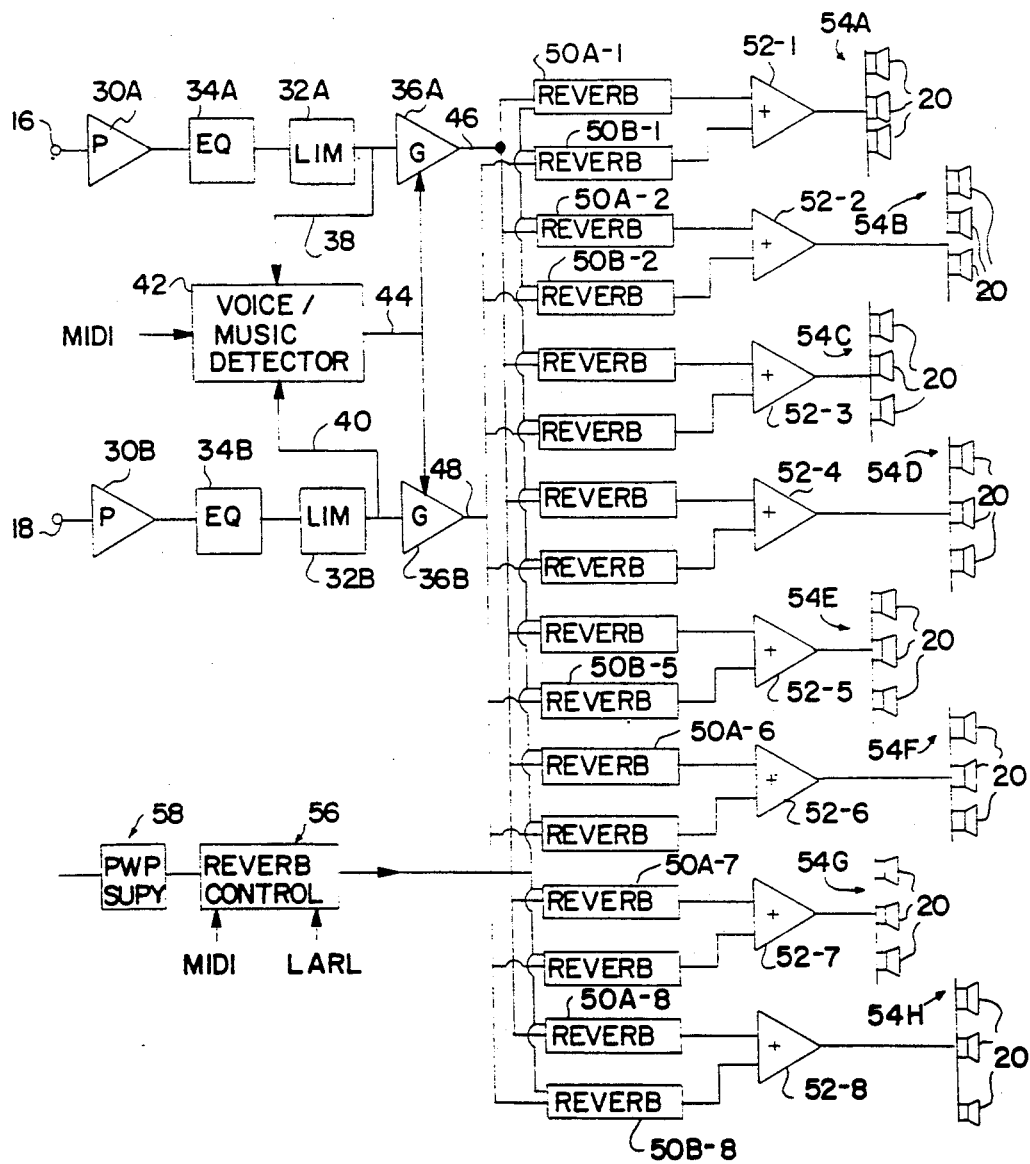
FIG. 4 is a block diagram of the electroacoustic enhancement system employed in the concert hall shown in FIGS. 1 and 2.

Each microphone 16, 18, as indicated in FIG. 4, is connected through microphone preamplifier 30, limiter 32, and equalizer 34 to gain control circuit 36. The outputs from limiters 32 are applied over lines 38, 40 to voice/music detector 42 whose output on line 44 is applied to the gain control circuits 36A, 36B.

Connected to the output 46 of gain control amplifier 36A is a set of eight reverberation devices 50A-1–50A-8, the output of each of which is connected to a corresponding stereo power amplifier 52-1–52-8. Connected to the output of each stereo amplifier 52 is a bank 54-1–54-8 of about fifteen loudspeakers 20.

A second similar array of reverberation units 50B-1–50B-8 are connected to output line 48 from gain control amplifier 36B. The outputs of those reverberations units 50B are connected to second inputs of power amplifiers 52-1–52-8 for application to the corresponding banks 54-A–54-H of loudspeakers 20.

The connection of microphones 16, 18 to loudspeakers 20 through an array of independent reverberators 50 is such that the statistical stability depends on the number of reverberators, which is the product of the number of speaker banks 54 and the number of microphones.

Each reverberation unit 50 has a transfer function which is both different from each other reverberation unit 50, and is also continuously and randomly varying in time. The impulse response of each reverberator unit 50 gives a series of output delayed pulses of various amplitudes, the amplitude of each being on the average a decreasing function of the delay time of the pulse such that natural reverberation is emulated. The shape of the time/energy curve in each reverberator 50 is tailored to allow a relatively gradual buildup in energy over a twenty millisecond period followed by a relatively constant energy level for the next 100 to 150 milliseconds followed by an exponential delay at a rate set by the reverb time in electronic control 56. In each reverberation unit, the amplitude and time delay of each delayed pulse is a random function of time, with a sufficient speed of change such that after about one second, the impulse response has no obvious similarity to the previous response.

Figure 5A:
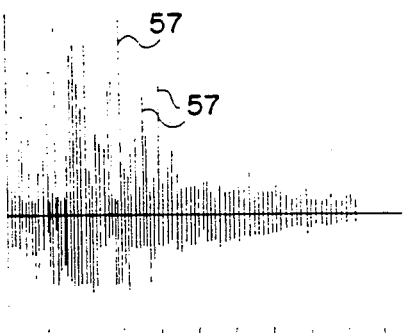
FIGS. 5A and 5B are diagrams indicating the nature of transfer functions in the reverberation units.
Figure 5B:
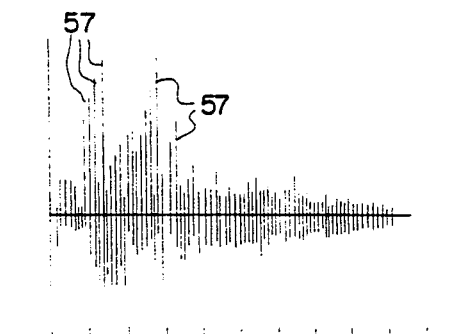

FIGS. 5A and 5B illustrate examples of transfer functions (impulse responses) of a reverberation unit 50, there being fifty milliseconds per scale division; and the graph of FIG. 5B was made about one minute after the graph of FIG. 5B. Those transfer functions are electronically generated decaying impulse responses of input signals of the type described in Griesinger, "Practical Processors and Programs for Digital Reverberation" Proceedings of the 7th International Conference of the Audio Engineering Society (pages 187-195) (1990), the disclosure of which is expressly incorporated herein by reference. The amplitude and time delay of each reflection 57 varies randomly with time so that there is no correlation between the individual transfer functions, and after a period of about one second, there is no autocorrelation of an individual transfer function with itself.

Control 56 includes two Lexicon 480 processors and a Lexicon Midi controller that generate the adjustable time delays for the reverberation units 50. Uninterruptable power supply 58 for the digital equipment reduces possible system confusion from power supply transients and the like. The microphone signals, after having passed through the reverberation units 50 are summed by amplifiers 52 before being sent to speaker banks 54. In this system, all components in the transfer of energy from microphones 16, 18 vary with time.

Figure 6:
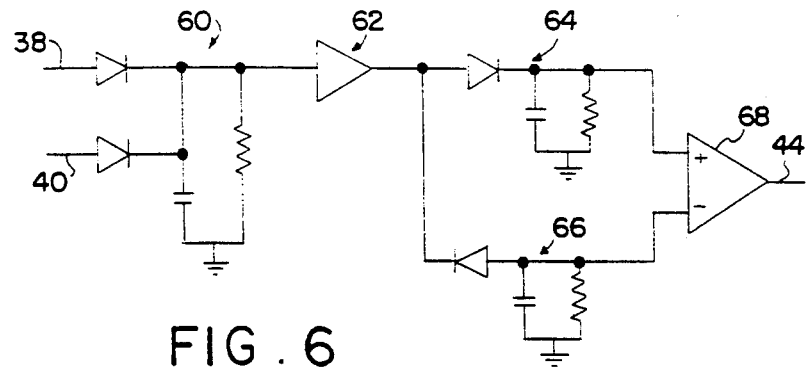
FIG. 6 is a block diagram of the voice/music detector employed in the system shown in FIG. 4.

Automatic sensing circuit 42 modifies the gain by small amounts depending on the peak-to-valley ratio of the microphone signal. With reference to FIG. 6, that circuit includes envelope detector 60 (that has an RC time constant of about 0.1 second) and responds to inputs on lines 38 and 40. The output of envelope detector 60 is passed through log amplifier 62 to peak detector circuit 64 that has a RC time constant of about one second and valley detector 66 that also has a RC time constant of about one second. The outputs of detectors 64, 66 are applied through scaling amplifier 68 for output on line 44, the difference between the peak and valley levels being used to match the reverb level to the requirements of the input music or other input from microphones 16, 18.

Loudspeakers 20 are disposed on ceiling, wall and balcony roof surfaces such that no two adjacent loudspeakers are driven from the same channel, in the nature of "tiling" a surface with different colors so that no boundaries share the same color. An example of such tiling is shown in FIG. 3 with four banks identified by the letters A-D.

An electroacoustic system of this type is capable of making a relatively acoustically dead auditorium satisfactory for both music and speech and is both less expensive and more successful than a system which uses movable curtains or other variable absorption to achieve a similar result. The system also has substantial advantages over a multi-channel reverberation system (MCR) in terms of stability, coloration, and independent control over reverb time and reverb level as well as being less expensive and less complex than an MCR or an ACS (acoustic control system) system.

While a particular embodiment of the invention has been shown and described, various modifications will be apparent to those skilled in the art and therefore it is not intended that the invention be limited to the disclosed embodiment or to details thereof, and departures may be made therefrom within the spirit and scope of the invention.

What is claimed is:

1. An electroacoustic system for acoustic enhancement of a room that includes a sound source location
    a microphone adapted to be spaced from said sound source location,
    an array of loudspeakers arranged in at least four interleaved speaker banks, each said speaker bank including at least one loudspeaker, and
    signal processing electronics connected between said microphone and said speaker banks, said signal processing electronics including
    an input channel, circuitry connecting said microphone to said input channel,
    a plurality of output channels corresponding in number to the number of said speaker banks, circuitry connecting each said output channel to a corresponding one of said speaker banks, and at least four statistically independent time-variant reverberation units responsive to input signals from said microphone on said input channel for producing output signals on said output channels for driving said speaker banks, each said reverberation unit having a transfer function that is varied so that there is no correlation between individual transfer functions of said reverberation units, and after a period of about one second, there is no auto-correlation of an individual transfer function with itself.

2. The system of claim 1 wherein said signal processing electronics are of the digital type.

3. The system of claim 1 wherein said circuitry connecting said microphone to said input channel includes one-third octave equalizer circuitry connected in series circuit between said microphones and said reverberation units for compensating for loudspeaker frequency response.

4. The system of claim 1 wherein said signal processing electronics includes analysis circuitry responsive to music, speech or other input from said microphone for adjusting reverberation characteristics of said reverberation units.

5. The system of claim 1 wherein each said reverberation unit has an initial time-energy curve with a slow build up followed by a long diffuse plateau before exponential decay.

6. The system of claim 1 wherein each said microphone is of the directional type.

7. The system of claim 1 wherein said system includes a plurality of microphones spaced from said sound source location, each said speaker bank includes a plurality of loudspeakers, and said signal processing electronics includes a plurality of input channels corresponding in number to the number of said microphones, and the number of said statistically independent time-variant reverberation units is equal to at least the product of the number of said microphones and the number of said speaker banks.

8. The system of claim 1 and further including a one-third octave equalizer, a microphone pre-amplifier, and a limiter connected in series circuit between said microphone and said reverberation units.

9. The system of claim 1 wherein said circuitry connecting each said output channel to a corresponding one of said speaker banks includes a power amplifier connected in series circuit between a said reverberation unit and its corresponding speaker bank.

10. An electroacoustic system for acoustic enhancement of a room that includes a sound source location comprising a microphone adapted to be spaced from said sound source location, an array of loudspeakers arranged in at least four interleaved speaker banks, each said speaker bank including at least one loudspeaker, and signal processing electronics connected between said microphone and said speaker banks, said signal processing electronics including an input channel, circuitry connecting said microphone to said input channel, a plurality of output channels corresponding in number to the number of said speaker banks, circuitry connecting each said output channel to a corresponding one of said speaker banks, and at least four statistically independent time-variant reverberation units responsive to input signals from said microphone on said input channel for producing output signals on said output channels for driving said speaker banks, each said reverberation unit having a randomly varying transfer function.

11. An electroacoustic system for acoustic enhancement of a room that includes a sound source location comprising an microphone adapted to be spaced from said sound source location, an array of loudspeakers arranged in at least four interleaved speaker banks, each said speaker bank including at least one loudspeaker, and signal processing electronics connected between said microphone and said speaker banks, said signal processing electronics including an input channel, circuitry connecting said microphone to said input channel, a plurality of output channels corresponding in number to the number of said speaker banks, circuitry connecting each said output channel to a corresponding one of said speaker banks, and at least four statistically independent time-variant reverberation units responsive to input signals from said microphone on said input channel for producing output signals on said output channels for driving said speaker banks, said reverberation units being identical in design, each said reverberation unit having a transfer function, and further including means for automatically varying said transfer functions of said reverberation units independently of one another with different sets of random numbers.

12. An electroacoustic system for acoustic enhancement of a room that includes a sound source location comprising a microphone adapted to be spaced from said sound source location, an array of loudspeakers arranged in at least four interleaved speaker banks, each said speaker bank including at least one loudspeaker, signal processing electronics connected between said microphone and said speaker banks, said signal processing electronics including an input channel, circuitry connecting said microphone to said input channel, a plurality of output channels corresponding in number to the number of said speaker banks, circuitry connecting each said output channel to a corresponding one of said speaker banks, said speakers in said interleaved speaker banks being disposed so that no two adjacent speakers are driven from the same output channel and every speaker in each said speaker bank is spaced from every other speaker in that speaker bank by at least one speaker from another speaker bank and at least four statistically independent time-variant reverberation units responsive to input signals from said microphone on said input channel for producing output signals on said output channels for driving said speaker banks.

13. The system of claim 12 wherein the transfer function of each said reverberation unit is varied randomly with time so that there is no correlation between the individual transfer functions of said reverberation units, and after a period of about one second, there is no auto-correlation of an individual transfer function with itself.

14. An electroacoustic system for acoustic enhancement of a room that includes a sound source location comprising
- a microphone of the directional type adapted to be spaced from said sound source location,
- an array of loudspeakers arranged in at least four interleaved speaker banks, each said speaker bank including at least one loudspeaker,
- signal processing electronics connected between said microphone and said speaker banks, said signal processing electronics including
- an input channel, circuitry connecting said microphone to said input channel,
- a plurality of output channels corresponding in number to the number of said speaker banks, circuitry connecting each said output channel to a corresponding one of said speaker banks, and
- at least four statistically independent time-variant reverberation units responsive to input signals from said microphone on said input channel for producing output signals on said output channels for driving said speaker banks such that the relationship:

$$SD/ECD <= \sqrt{(\text{\# of reverberation units})}/1.75$$

is satisfied.

15. An electroacoustic system for acoustic enhancement of a room that includes a sound source location comprising
- a microphone adapted to be spaced from said sound source location,
- an array of loudspeakers arranged in at least four interleaved speaker banks, each said speaker bank including at least one loudspeaker, and
- signal processing electronics connected between said microphone and said speaker banks, said signal processing electronics including
- an input channel, circuitry connecting said microphone to said input channel,
- a plurality of output channels corresponding in number to the number of said speaker banks, circuitry connecting each said output channel to a corresponding one of said speaker banks,
- at least four statistically independent time-variant reverberation units responsive to input signals from said microphone on said input channel for producing output signals on said output channels for driving said speaker banks, and
- analysis circuitry responsive to music, speech or other input from said microphone for adjusting reverberation characteristics of said reverberation units, said analysis circuitry including envelope detector circuitry that has a short RC time constant, and peak detector circuitry and valley detector circuitry, each of said peak and valley detector circuits having an RC time constant that is several times as long as the time constant of said envelope detector circuitry.

16. The system of claim 15 wherein the relationship:

$$SD/ECD <= \sqrt{(\text{\# of reverberation units})}/1.75$$

is satisfied.

17. An electroacoustic system for acoustic enhancement of a room that includes a sound source location comprising
- a plurality of microphones spaced from said sound source location,
- an array of loudspeakers arranged in a plurality of speaker banks, and
- signal processing electronics connected between each said microphone and said loudspeakers, said signal processing electronics including
- an plurality of input channels corresponding in number to the number of said microphones, circuitry connecting each said microphone to a said input channel,
- a plurality of output channels, circuitry connecting said output channels to said loudspeakers,
- a plurality of reverberation units responsive to input signals from said microphones on said input channels for producing output signals on said output channels for driving said loudspeakers, the number of said reverberation units being equal to at least the product of the number of said microphones and the number of said speaker banks, and
- analysis circuitry responsive to music, speech or other input from said microphone for automatically adjusting reverberation characteristics of said reverberation units, such that the relationship:

$$SD/ECD <= \sqrt{(\text{\# of reverberation units})}/1.75$$

is satisfied.

18. The system of claim 17 wherein said speakers in said speaker banks are disposed so that no two adjacent speakers are driven from the same output channel (every speaker in each said speaker bank is spaced from every other speaker in that speaker bank by at least one speaker from another speaker bank).

19. An electroacoustic system for acoustic enhancement of a room that includes a sound source location comprising
- a plurality of microphones of the directional type adapted to be spaced from said sound source location,
- an array of loudspeakers arranged in at least four interleaved speaker banks, each said speaker bank including a plurality of loudspeakers,
- signal processing electronics connected between said microphones and said speaker banks, said signal processing electronics including
- an plurality of input channels corresponding in number to the number of said microphones, circuitry connecting each said microphone to a said input channel,
- a plurality of output channels corresponding in number to the number of said speaker banks, circuitry connecting each said output channel to a corresponding one of said speaker banks, and
- a plurality of statistically independent time-variant reverberation units responsive to input signals from said microphone on said input channel for producing output signals on said output channels for driving said speaker banks and, the number of said statistically independent time variant reverberation units being equal to at least the product of the number of said microphones and the number of said speaker banks, such that the relationship:

$$SD/ECD <= \sqrt{(\# \text{ of reverberation units})}\,/1.75$$

is satisfied.

20. The system of claim 19 wherein said speakers in said interleaved speaker banks are disposed so that no two adjacent speakers are driven from the same output channel (every speaker in each said speaker bank is spaced from every other speaker in that speaker bank by at least one speaker from another speaker bank).

21. The system of claim 20 wherein each said reverberation unit has a randomly varying transfer function.

22. The system of claim 21 wherein said reverberation units are identical in design, and further including means for varying said transfer functions of said reverberation units independently of one another with different sets of random numbers.

23. The system of claim 22 wherein the transfer function of each said reverberation unit is varied randomly with time so that there is no correlation between the individual transfer functions of said reverberation units, and after a period of about one second, there is no auto-correlation of an individual transfer function with itself.

24. The system of claim 23 wherein each said reverberation unit has an initial time-energy curve with a relatively slow build up followed by a relatively long diffuse plateau before exponential decay.

25. The system of claim 24 wherein said circuitry connecting each said output channel to a corresponding one of said speaker banks includes a power amplifier connected in series circuit between a said reverberation unit and its corresponding speaker bank.

26. The system of claim 25 wherein said signal processing electronics are of the digital type, and include one-third octave equalizer circuitry connected in series circuit between said microphones and said reverberation units for compensating for loudspeaker frequency response.

27. The system of claim 26 wherein said signal processing electronics includes analysis circuitry responsive to music, speech or other input from said microphones for automatically adjusting reverberation characteristics of said reverberation units, said music/speech analysis circuitry including envelope detector circuitry that has a short RC time constant, peak and valley detector circuitries, each of said peak and valley detector circuitries having an RC time constant that is several times as long as the time constant of said envelope detector circuitry, and gain modifying circuitry.

28. An electroacoustic system for acoustic enhancement of a room that includes a sound source location comprising
a microphone spaced from said sound source location,
an array of loudspeakers,
signal processing electronics connected between said microphone and said loudspeakers, said signal processing electronics including
an input channel, circuitry connecting said microphone to said input channel,
a plurality of output channels, circuitry connecting said output channels to said loudspeakers,
a plurality of reverberation units responsive to input signals from said microphone on said input channel for producing output signals on said output channels for driving said loudspeakers, and
analysis circuitry responsive to music, speech or other input from said microphone for automatically adjusting reverberation characteristics of said reverberation units,
said analysis circuitry including envelope detector circuitry that has a short RC time constant, and peak detector circuitry and valley detector circuitry, each of said peak and valley detector circuities having an RC time constant that is several times as long as the time constant of said envelope detector circuitry.

29. The system of claim 18 wherein each said reverberation unit has a transfer function, and further including means for varying the transfer function of each said reverberation unit randomly with time so that there is no correlation between individual transfer functions of said reverberation units, and after a period of about one second, there is no auto-correlation of an individual transfer function with itself.

30. The system of claim 29 wherein said music/speech analysis circuitry includes envelope detector circuitry that has a short RC time constant, and peak detector circuitry and valley detector circuitry, each of said peak and valley detector circuitries having an RC time constant that is several times as long as the time constant of said envelope detector circuitry.

* * * * *